United States Patent
Takano

(10) Patent No.: US 8,363,419 B2
(45) Date of Patent: Jan. 29, 2013

(54) CIRCUIT DEVICE

(75) Inventor: Yoh Takano, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 345 days.

(21) Appl. No.: 12/667,031

(22) PCT Filed: Jun. 24, 2008

(86) PCT No.: PCT/JP2008/001645
§ 371 (c)(1),
(2), (4) Date: Mar. 29, 2010

(87) PCT Pub. No.: WO2009/001554
PCT Pub. Date: Dec. 31, 2008

(65) Prior Publication Data
US 2010/0188059 A1    Jul. 29, 2010

(30) Foreign Application Priority Data
Jun. 27, 2007   (JP) .................... 2007-169772

(51) Int. Cl.
H05K 1/18   (2006.01)

(52) U.S. Cl. ...................... 361/763; 361/760

(58) Field of Classification Search .......... 174/255–262; 361/760, 783; 257/735, 736, 666
See application file for complete search history.

(56) References Cited

U.S. PATENT DOCUMENTS

| | | | |
|---|---|---|---|
| 6,326,678 B1 * | 12/2001 | Karnezos et al. | 257/666 |
| 6,400,010 B1 * | 6/2002 | Murata | 257/706 |
| 7,078,797 B2 * | 7/2006 | Suzuki et al. | 257/690 |
| 7,491,894 B2 * | 2/2009 | Suzuki et al. | 174/260 |

FOREIGN PATENT DOCUMENTS

| | | |
|---|---|---|
| JP | 04-162691 | 6/1992 |
| JP | 06-037421 | 2/1994 |
| JP | 2005-005445 | 1/2005 |
| JP | 2005-277174 | 10/2005 |
| JP | 2007-157773 | 6/2007 |

OTHER PUBLICATIONS

International Preliminary Report on Patentability and Written Opinion of the International Searching Authority, issued in International Patent Application No. PCT/JP2008/001645, mailed Sep. 30, 2008.

* cited by examiner

*Primary Examiner* — Yuriy Semenenko

(74) *Attorney, Agent, or Firm* — McDermott Will & Emery LLP

(57) ABSTRACT

An insulating resin layer (30) is formed on a metal substrate (20), and a wiring is formed on the insulating resin layer (30). A circuit composed of a circuit element (50) and a passive element (60) is formed on the wiring (40), and the metal substrate (20) is covered with an over coat (80) and a sealing resin member (90). The insulating resin layer (30) is provided with an opening (31) so that a part of the metal substrate (20) is exposed therefrom. The exposed part of the metal substrate (20) is connected to one terminal of a capacitor (62) through a conductive wire (42), and the other terminal of the capacitor (62) is connected to the ground potential.

1 Claim, 11 Drawing Sheets

CIRCUIT DEVICE

RELATED APPLICATIONS

This application is the U.S. National Phase under 35 U.S.C. §371 of International Application No. PCT/JP2008/001645, filed on Jun. 24, 2008, which in turn claims the benefit of Japanese Application No. 2007-169772, filed on Jun. 27, 2007, the disclosures of which Applications are incorporated by reference herein.

TECHNICAL FIELD

The present invention relates to a circuit device. More specifically, the invention relates to a circuit device having circuit elements disposed on an insulating resin layer on a metal substrate.

BACKGROUND TECHNOLOGY

In recent years, the power module has been in growing demand for smaller size and better heat release in order to achieve improved space efficiency. Also, there has been demand for lower energy cost and reduced environmental load of the power module. Developed to meet these demands are intelligent power modules (IPMs), which are circuit devices having both a control unit and a power device mounted on a single metal substrate.

FIG. 11 is a cross-sectional view schematically illustrating a structure of a conventional circuit device. An insulating resin layer 510 is formed on a metal substrate 500 made of aluminum or the like. Wirings 520 made of copper, for instance, are formed on the insulating resin layer 510. Further, circuit elements 530, such as transistors and ICs, and passive elements 540, such as resistors and capacitors, are mounted on the wirings 520 through the medium of solder 551, thereby realizing a predetermined circuit. When the circuit elements 530 are to be mounted face-up, the electrodes of the circuit elements 530 are connected to the wirings 520 by wire bonding using gold wire 532. An external lead 550 is connected to an external electrode terminal 552 through the medium of solder 551, and a part of the external lead 550 is exposed outside from a sealing resin member 580 to be described later.

Note that the insulating resin layer 510 is provided with an opening which allows a part of the metal substrate 500 to be exposed. The exposed part of the metal substrate 500 is connected to a wiring 520a which is connected to ground potential. As a result, the metal substrate 500 functions as a shield even when the circuit elements 530 are in operation, so that malfunction of the circuit and occurrence of noise are being suppressed.

An overcoat 560 is formed to cover solder joints, gold wires 532, circuit elements 530, and passive elements 540.

The sealing resin member 580 includes a support 582 and a sealing resin layer 584. The support 582 and the sealing resin layer 584 are both made of a thermoplastic resin. The sealing resin 580 is formed by injection molding in which the metal substrate 500 placed on the support 582 is coated with the sealing resin layer 584. This produces a circuit device of a full-molded structure.

[Patent Document 1] Japanese Patent Application Publication No. 2005-277174.

DISCLOSURE OF THE INVENTION

Problems to be Solved by the Invention

In a conventional circuit device as shown in FIG. 11, even when a capacitance is produced between the wiring 520 and the metal substrate 500, there results no variation in the potential of the metal substrate 500 because the metal substrate 500 is connected to ground potential. This has the effects of preventing an amplifier circuit or the like from malfunctioning due to noise. Nevertheless, when the metal substrate 500 is connected to ground potential, it is necessary to coat the metal substrate 500 with an insulator in order to prevent short-circuiting therethrough. And the coating of the metal substrate 500 with the insulator results in a drop in the heat transference of the metal substrate 500, which in turn lowers the heat release performance of the circuit device as a whole.

The present invention has been made in view of these problems to be solved, and a purpose thereof is to provide a technology for structuring a circuit device, having circuit elements disposed on an insulating resin layer on a metal substrate, which can prevent the "sneaking in" of noise from a circuit element into another circuit element through the metal substrate without causing a loss of heat release performance of the metal substrate.

Means for Solving the Problems

One embodiment of the present invention relates to a circuit device. This circuit device comprises: a metal substrate; an insulating resin layer disposed on the metal substrate; a wiring disposed on the insulating resin layer; a circuit element disposed on the wiring; and a capacitor, one terminal thereof being connected to the metal substrate and the other terminal thereof being connected to a fixed potential.

Another embodiment of the present invention relates also to a circuit device. This circuit device comprises: a metal substrate; an insulating resin layer disposed on the metal substrate; a wiring disposed on the insulating resin layer; a circuit element disposed on the wiring; and a capacitor, one terminal thereof being connected to the metal substrate and the other terminal thereof being connected to a variation potential which varies in such a manner as to cancel the potential of the metal substrate. In this embodiment, the variation potential may be in reverse phase with the potential of the circuit element.

Still another embodiment of the present invention relates also to a circuit device. This circuit device comprises: a metal substrate; an insulating resin layer disposed on the metal substrate; a wiring disposed on the insulating resin layer; a circuit element disposed on the wiring; and a means which applies a voltage, used to offset the potential of the metal substrate, to the metal substrate when the potential of the metal substrate varies, so as to maintain the potential of the metal substrate at ground level.

Still another embodiment of the present invention relates also to a circuit device. This circuit device comprises: a metal substrate; an insulating resin layer disposed on the metal substrate; a wiring disposed on the insulating resin layer; a circuit element disposed on the wiring; and a resistor, one terminal thereof being connected to the metal substrate and the other terminal thereof being connected to a fixed potential. In this embodiment, the resistor may be cut off when a current which is greater than a reference current flows.

Optional combinations of the aforementioned constituting elements may also be within the scope of the invention protected by the present patent application.

Effect of the Invention

According to the present invention, a circuit device, having circuit elements disposed on an insulating layer on a metal substrate, can prevent the "sneaking in" of noise from a circuit element into another circuit element through the metal substrate without causing a loss of heat radiating performance of the metal substrate.

DESCRIPTION OF THE REFERENCE NUMERALS

Figure 1:
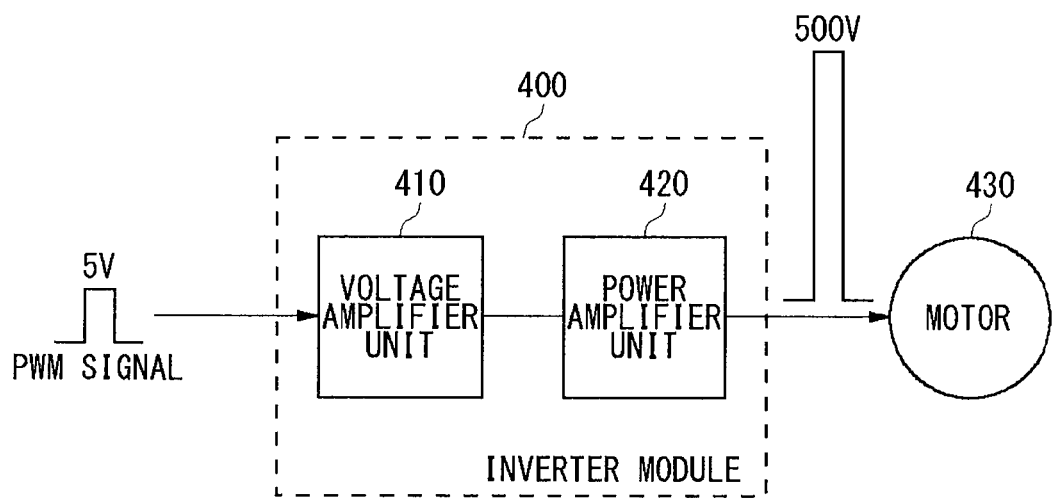
FIG. 1 is a schematic illustration of an inverter module where a circuit device according to a first embodiment of the present invention is used.

10 Circuit device
20 Metal substrate
30 Insulating resin layer
40 Wiring
50 Circuit element
52 Gold wire
60 Passive element
70 External lead
71 Soldering
72 External electrode terminal
80 Overcoat
90 Sealing resin member

BEST MODE FOR CARRYING OUT THE INVENTION (First Embodiment)

Figure 2:
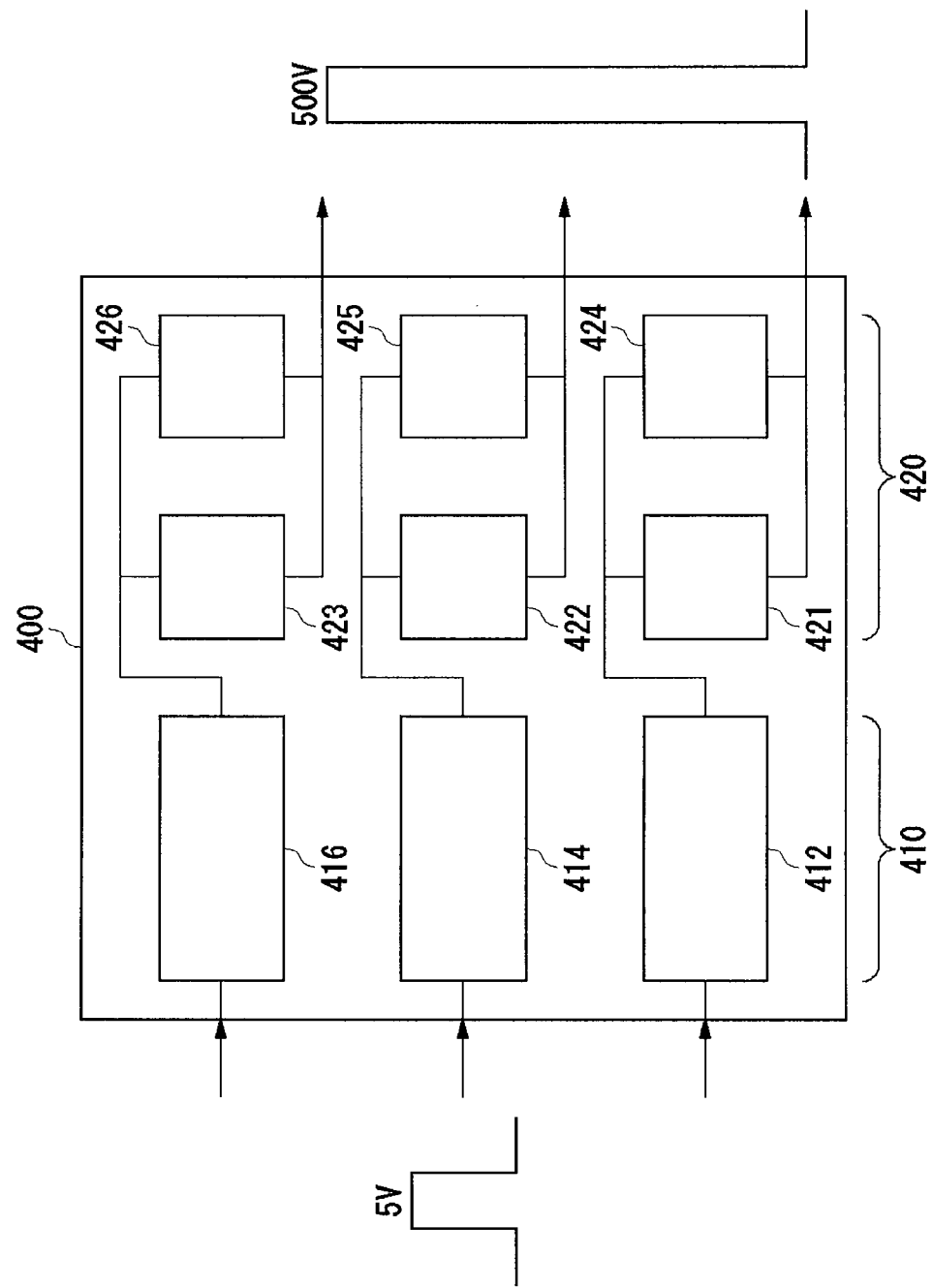
FIG. 2 is a schematic diagram showing a structure of an inverter module.

FIG. 1 is a schematic illustration of an inverter module where a circuit device according to a first embodiment of the present invention is used. FIG. 2 is a schematic diagram showing a structure of the inverter module. PWM (Pulse Width Modulation) signals are inputted to an inverter module 400. The PWM signal inputted to the inverter module 400 is normally at a logic level (5V). The inverter module 400 includes a voltage amplifier unit 410 and a power amplifier unit 420, and the PWM signal of 5 V is voltage-amplified and power-amplified to the PWM signal of 500 V so as to drive a motor 430. The three-phase motor 430 requires three phases which are U-phase, V-phase and W-phase. The voltage amplifier unit 410 has booster circuits 412, 414 and 416 corresponding to the U-phase, the V-phase and the W-phase, respectively. The power amplifier unit 420 has power elements 421 and 424 corresponding to the U-phase, power elements 422 and 425 corresponding to the V-phase, and power elements 423 and 426 corresponding to the W-phase.

Figure 3:
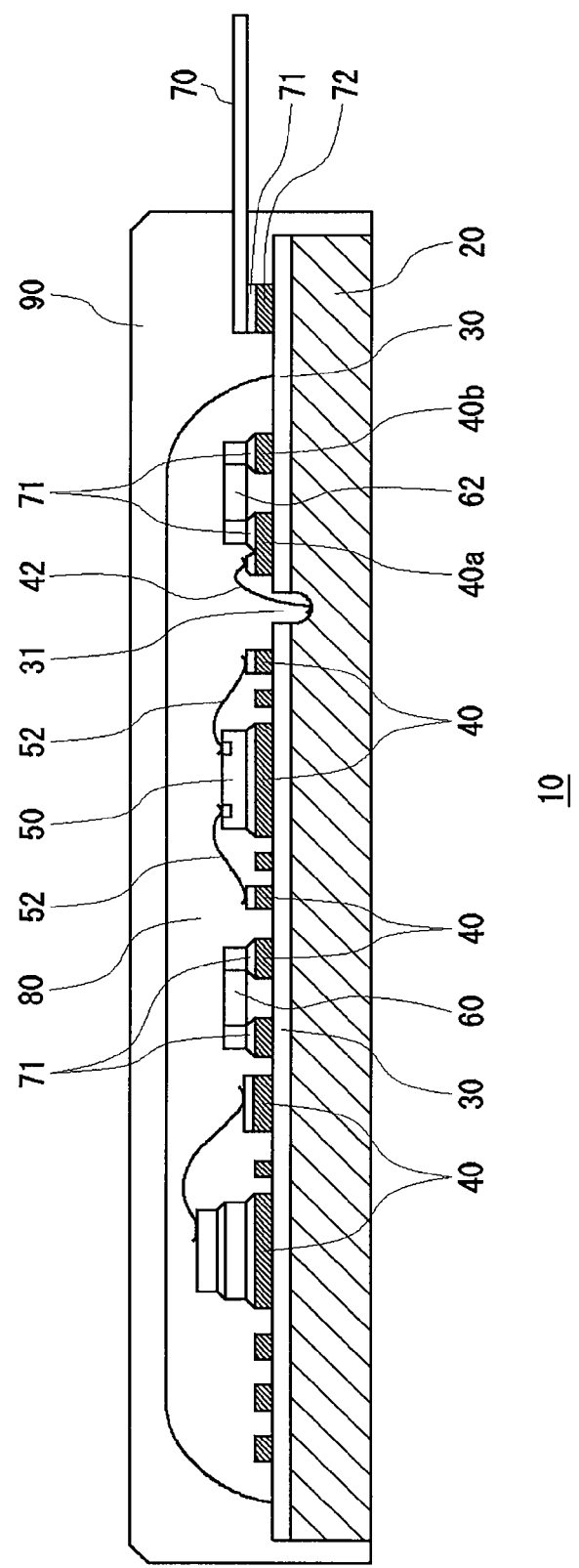
FIG. 3 is a cross-sectional view schematically showing a structure of a circuit device according to a first embodiment of the present invention.

FIG. 3 is a cross-sectional view schematically showing a structure of a circuit device 10 according to the first embodiment of the present invention. As shown in FIG. 3, an insulating resin layer 30 is formed on a metal substrate 20 in the circuit device 10 according to the first embodiment.

An example of the metal substrate 20 is a cladding material where a lower metal layer made of a metal, such as aluminum and copper, an alloy and copper, an intermediate metal layer, formed on the lower metal layer, which is made of a Fe—Ni-based alloy (so-called inver alloy), and an upper metal layer, formed on the intermediate metal layer, which is made of copper are stacked together.

The material used to form the insulating resin layer 30 is, for instance, a melamine derivative, such as BT resin, or a thermosetting resin, such as liquid-crystal polymer, epoxy resin, PPE resin, polyimide resin, fluorine resin, phenol resin or polyamide bismaleimide. From the viewpoint of improving the heat radiation of the circuit device 10, it is desirable that the insulating resin layer 30 has a high thermal conductivity. In this respect, it is preferable that the insulating resin layer 30 contains, as a high thermal conductive filler, silver, bismuth, copper, aluminum, magnesium, tin, zinc, or an alloy thereof.

Wirings 40 made of copper, for instance, is formed on the insulating resin layer 30. Further, circuit elements 50 such as transistors and ICs, and passive elements 60, such as resistors and capacitors, are mounted on the wirings 40 through the medium of solder 71, thereby realizing a predetermined circuit. When the circuit elements 50 are to be mounted face-up, the electrodes of the circuit elements 50 are connected to the wirings 40 by wire bonding using gold wire 52. An external lead 70 is connected to an external electrode terminal 72 through the medium of solder 71, and a part of the external lead 70 is exposed outside from a sealing resin member 90 to be described later.

In the present embodiment, a capacitor 62 is mounted on wirings 40a and 40b through the medium of solder 71. One terminal of the capacitor 62 is connected to the wiring 40a via the solder 71. At the same time, the other terminal of the capacitor is connected to the wiring 40b via the solder 71.

An opening 31 is formed in the insulating resin layer 30 so that a part of the metal substrate is exposed thereon. The exposed part of the metal substrate 20 is connected to the wiring 40a via a conductive wire 42. That is, one terminal of the capacitor 62 is connected to the metal substrate 20. At the same time, the wiring 40b is connected to ground potential. That is, the other terminal of the capacitor 62 is connected to ground potential. Though in the present embodiment the other terminal of the capacitor 62 is connected to ground potential, the other terminal of the capacitor 62 may be connected to a fixed potential. Note that the fixed potential may be, for example, ground potential or a potential such as the power supply voltage of an amplifier and therefore may be either a positive or negative potential.

An overcoat 80 is so formed as to cover solder joints, the gold wire 52, the circuit elements 50, and the passive elements 60. The overcoat 80 is formed, using a thermosetting resin (e.g., epoxy resin), by a potting process. Provision of the overcoat 80 prevents fine wires (about 30 to 80 μm in thickness) from falling and being disconnected due to the resin injection pressure applied when the sealing resin member 90 is formed. Also, the overcoat 80 prevents the solder 71 from melting and causing defects due to an injection temperature of about 300° C. when the sealing resin member 90 is formed.

The sealing resin member 90 is made of a thermoplastic resin. The sealing resin member 90 is formed by injection molding in which the metal substrate 20 is coated with the thermoplastic resin. Note that the lower surface of the metal substrate 20 is not coated with the sealing resin member 90 and is therefore exposed.

Figure 4:
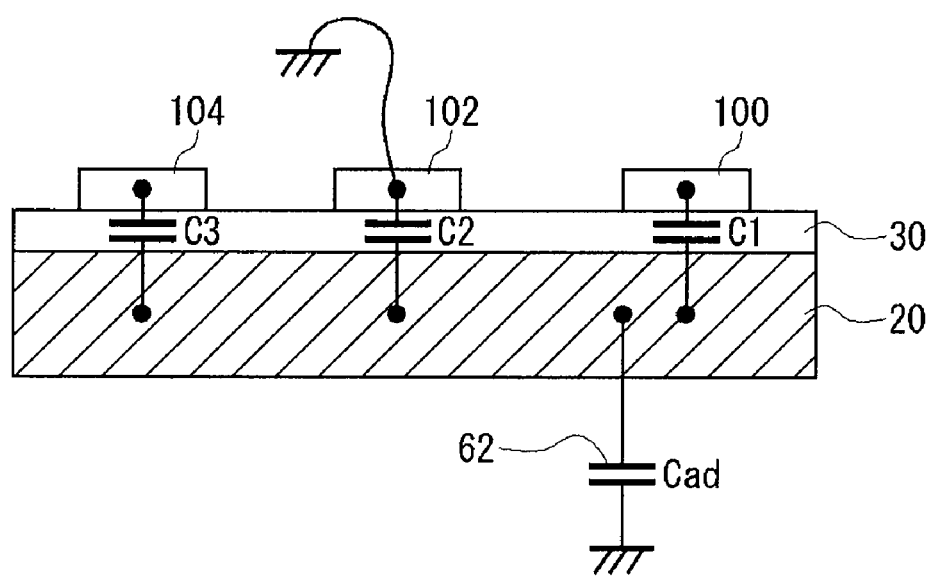
FIG. 4 is a schematic illustration showing capacitive coupling through a metal substrate in a circuit device according to a first embodiment.

FIG. 4 is a schematic illustration showing capacitive coupling through a metal substrate 20 in a circuit device according to the first embodiment. In this schematic illustration, a power element 100, a circuit element 102 (fixed node) with a fixed potential, and a circuit element 104 susceptible to the effects of potential variation are presented as examples of circuit elements mounted on the insulating resin layer 30.

The power element 100 corresponds to an active channel outputting a PWM signal among the six channels (power elements) in the inverter module shown in FIG. 2, for instance. The circuit element 102 corresponds to an inactive channel with a fixed potential among the six channels or a power source. The circuit element 104 corresponds to a circuit element constituting a booster circuit preceding the active channel.

It should be noted that the circuit element 104 is not limited to a digital circuit element used as a booster circuit in the inverter module mentioned above, and the circuit element 104 may also be an analog circuit element used as an amplifier for amplifying inputted analog signals. When the circuit element 104 is an amplifier for amplifying inputted analog signals, however, there may occur a variation in the potential of the metal substrate 20 due to the effects of the outputted analog signals. Then the SN ratio (signal-to-noise ratio) may get worse on account of noise entering in the different amplification stages of the amplifier.

Assume that C1 is the capacitance of a hypothetical capacitor formed between the power element 100 and the metal substrate 20 through the medium of the insulating resin layer 30. Assume that C2 is the capacitance of a hypothetical capacitor formed between the circuit element 102 connected to ground potential through the insulating resin layer 30 and the metal substrate 20. Also, assume that C3 is the capacitance of a hypothetical capacitor formed between a circuit element 104 node and the metal substrate 20 through the medium of the insulating resin layer 30. In addition, assume that $C_{ad}$ is the capacitance of a capacitor 62 connected between the metal substrate 20 and ground potential.

The potential of the metal substrate 20 changes under the effects of voltage of the power element 100. The potential variation of the metal substrate 20 becomes noise to the circuit element 104. On account of this noise, the circuit element 104 can malfunction. According to the present embodiment, however, the metal substrate 20 is connected to the capacitor 62 which is connected to ground potential at the other terminal thereof, so that the potential variation of the metal substrate 20 is reduced with the result of reduced likelihood of the circuit element 104 malfunctioning.

Now the potential control effect of the capacitor 62 on the metal substrate 20 will be explained. Firstly, let ΔVn denote the voltage variation of the power element 100, which is the noise source, and ΔVb denote the potential variation of the metal substrate 20. Then the following equation holds:

$$(\Delta Vn - \Delta Vb) \times C1 = \Delta Vb \times (C2 + C_{ad}) \qquad (1)$$

From this equation, the following equation can be derived:

$$\Delta Vb = (C1/(C1 + C2 + C_{ad})) \times \Delta Vn \qquad (2)$$

The noise the circuit element 104 is exposed to is in proportion to ΔVb. From Equation (2), therefore, it is evident that ΔVb can be reduced by the choice of larger $C_{ad}$, and by extension it is possible to prevent the malfunction of the circuit element 104.

(Experimental Example of Three-Phase Inverter Module)

The potential suppression effect of the metal substrate 20 when the above-described capacitor 62 is connected thereto has been checked using a three-phase inverter module. Specifically, the capacitance of the capacitor 62 used was 9400 pF (Two capacitors of 4700 pF each were used). For comparison, a checking has been done of the potential variation of the metal substrate 20 when the metal substrate 20 is not connected to the capacitor 62, that is, when the metal substrate 20 is in a floating state. Note that the amplitude of the PWM signal inputted was 5 V.

Figure 5:
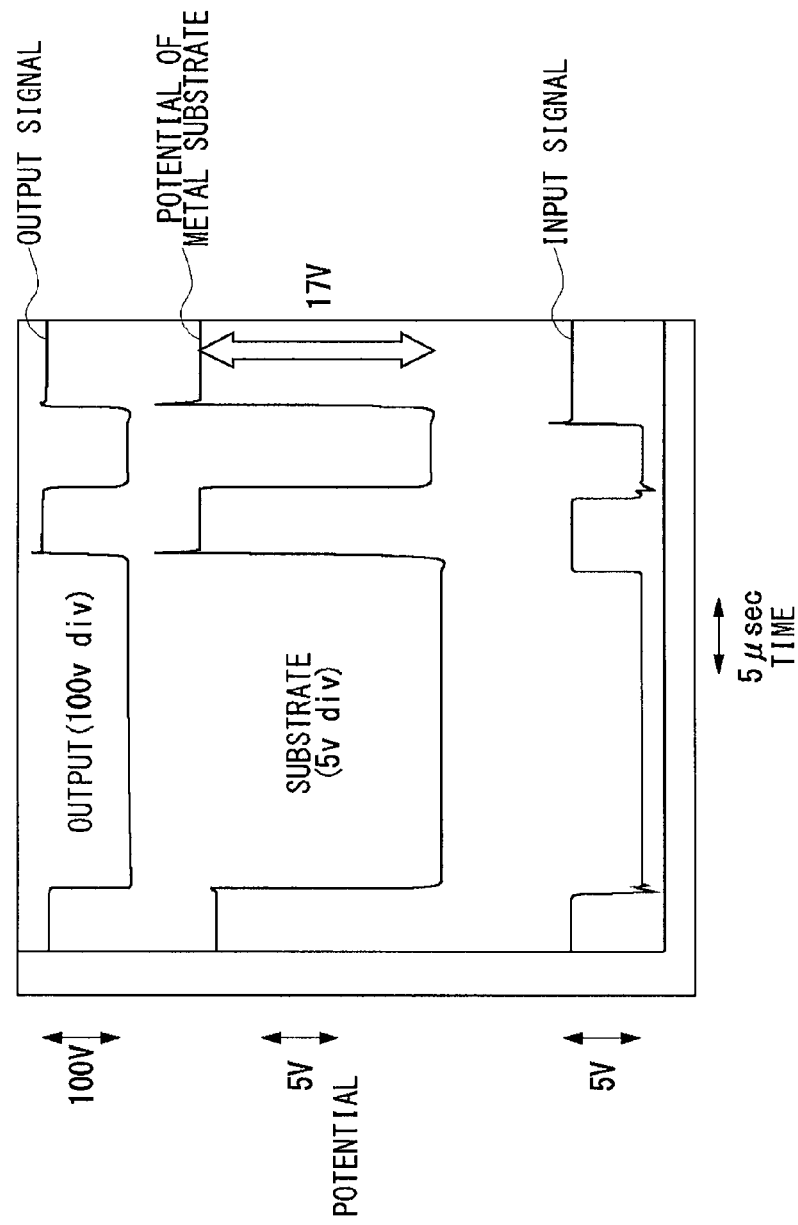
FIG. 5 is a graph showing the measurements of the voltage of an input signal, the voltage of an output signal, and the potential of a metal substrate when a capacitor is not connected to the metal substrate.
Figure 6:
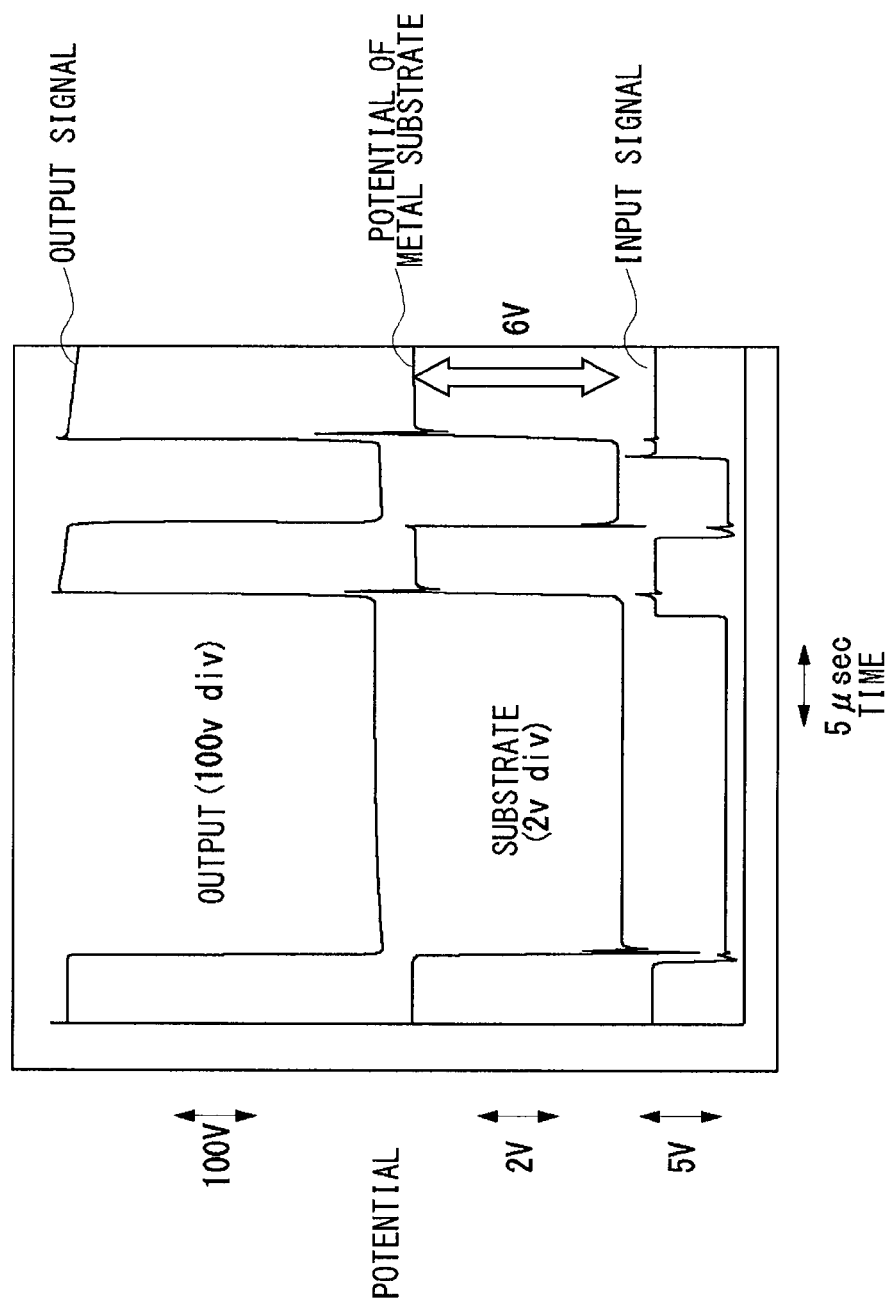
FIG. 6 is a graph showing the measurements of the voltage of an input signal, the voltage of an output signal, and the potential of a metal substrate when a capacitor is connected to the metal substrate.

FIG. 5 is a graph showing the measurements of the voltage of an input signal, the voltage of an output signal, and the potential of the metal substrate when the capacitor 62 is not connected to the metal substrate 20. FIG. 6 is a graph showing the measurements of the voltage of an input signal, the voltage of an output signal, and the potential of the metal substrate when the capacitor 62 is connected to the metal substrate 20. As shown in FIG. 5, when the capacitor 62 was not connected to the metal substrate 20, the potential variation of the metal substrate was about 17 V with the amplitude of the output signal set to 120 V, and malfunctions occurred with the amplitude of the output signal amplified to 125 V or above. In contrast to this, as shown in FIG. 6, when the capacitor 62 was connected to the metal substrate 20, it has been confirmed that with the amplitude of the output signal amplified to 450 V, the potential variation of the metal substrate was suppressed to about 6 V and no malfunctions occurred.

In a circuit device according to the present embodiment heretofore described, the potential variation of the metal substrate is reduced by a capacitor connected between the metal substrate and ground potential, so that it is possible to reduce the "sneaking in" of noise from a high-voltage circuit element, such as a power element, into another circuit element which is susceptible to the effect of potential variation.

Also, since the metal substrate is not connected directly to ground potential, a large current will not flow even if an external object comes in contact with the metal substrate. Accordingly, the circuit device in the present embodiment can have part of the metal substrate exposed. With a part of the metal substrate exposed, it is possible to reduce thermal resistance and improve the heat release performance of the circuit device.

(Second Embodiment)

The structure of a circuit device according to a second embodiment of the present invention is substantially the same as that of the first embodiment. The circuit device according to the present embodiment differs, however, in that one end of the capacitor 62 connected to the metal substrate 20 shown in FIG. 3 is not connected to ground potential but to a potential in reverse phase with the output signal of a power element. The potential in reverse phase with the output signal of the power element can be taken, for instance, from a midway stage of an amplifier amplifying the input signal. In this arrangement, the potential variation of the metal substrate 20 due to the output signal of the power element can be offset by the capacitor 62, so that the potential variation of the metal substrate 20 can be reduced more effectively. Thus, for a capacitance of the capacitor 62 smaller than that of the first embodiment, a sufficient noise reduction effect can be achieved.

(Experimental Example of Three-Phase Inverter Module)

Figure 7:
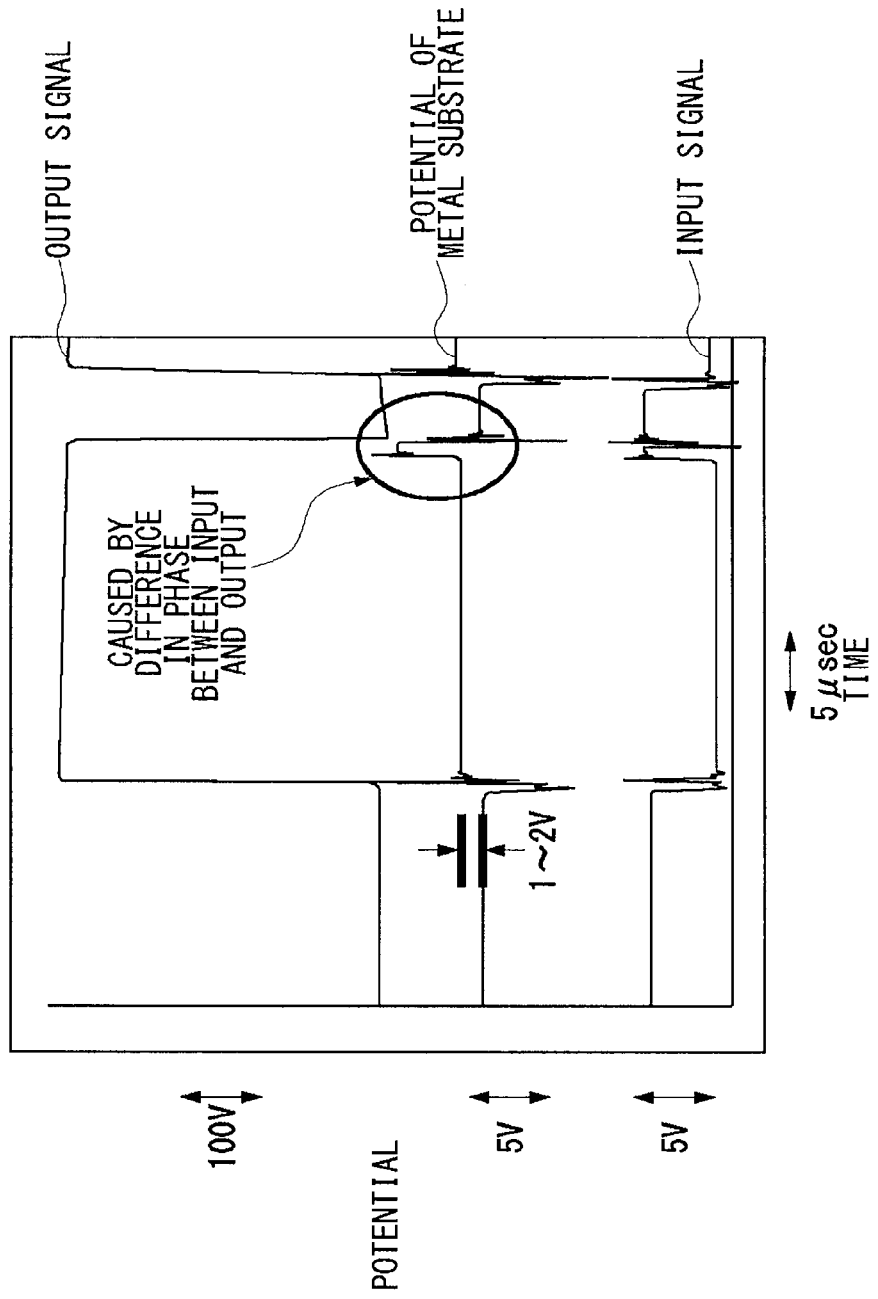
FIG. 7 is a graph showing the measurements of the potential in reverse phase, the voltage of an output signal, and the potential of a metal substrate when one end of a capacitor is connected to a potential in reverse phase with the output signal of a power element.

The potential suppression effect of the metal substrate 20 when one end of the capacitor 62 shown in FIG. 3 is connected to a potential (amplitude: 5 V) in reverse phase with the output signal of a power element has been checked using a three-phase inverter module. FIG. 7 is a graph showing the measurements of the potential in reverse phase, the voltage of an output signal, and the potential of the metal substrate when one end of the capacitor 62 is connected to a potential in reverse phase with the output signal of the power element. As shown in FIG. 7, when one end of the capacitor 62 is connected to a potential in reverse phase with the output signal of the power element, it has been confirmed that the potential variation of the metal substrate with the amplitude of the output signal amplified to 450 V was suppressed to about 1 to 2 V, which represents even smaller potential variation of the metal substrate than that in the first embodiment.

Experiments were conducted on the structures of the first embodiment and the second embodiment by halving the capacitance of the capacitor 62 shown in FIG. 3 (namely with the capacitor 62 of 4700 pF). In the first embodiment, malfunctions occurred when the output voltage of the power element was 397 V or above. In contrast to this, in the second embodiment, it has been confirmed that the operation was normal even when the output voltage of the power element was raised to 450 V. In other words, with the circuit device of the second embodiment, it has been confirmed that even when the capacitance of the capacitor 62 is made smaller than that of the first embodiment, a sufficient noise reduction effect can be achieved.

(Third Embodiment)

The structure of a circuit device according to a third embodiment of the present invention is substantially the same as that of the first embodiment. The circuit device according to the present embodiment differs, however, in that one end of the capacitor 62 connected to the metal substrate 20 shown in FIG. 3 is not connected to ground potential but to a control potential that is determined in accordance with the potential variation of the metal substrate 20. Specifically, a potential detecting means (not shown) for detecting the potential variation of the metal substrate 20 is provided, and when a potential variation of the metal substrate 20 is detected by the potential detecting means, a potential that can cancel the potential of the metal substrate 20 is set as the control potential. This further reduces the potential variation of the metal substrate 20, so that the noise reduction effect can be further enhanced.

(Fourth Embodiment)

Figure 8:
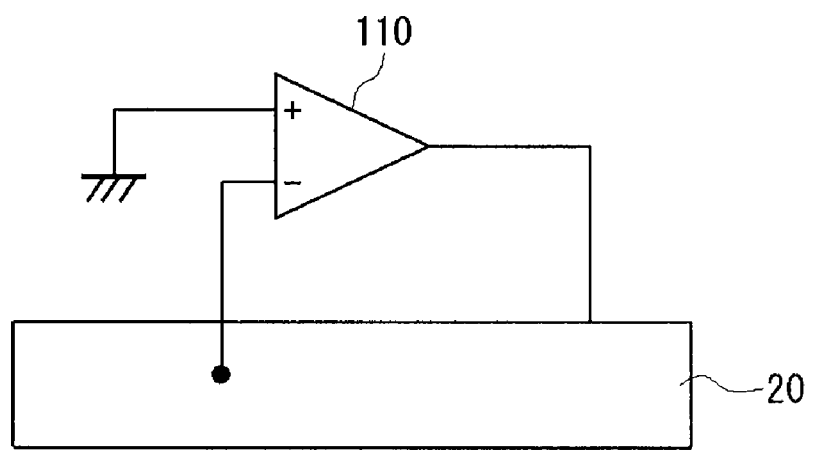
FIG. 8 shows a configuration of a circuit that contains a differential amplifier used in a circuit device according to a fourth embodiment of the present invention.
Figure 9:
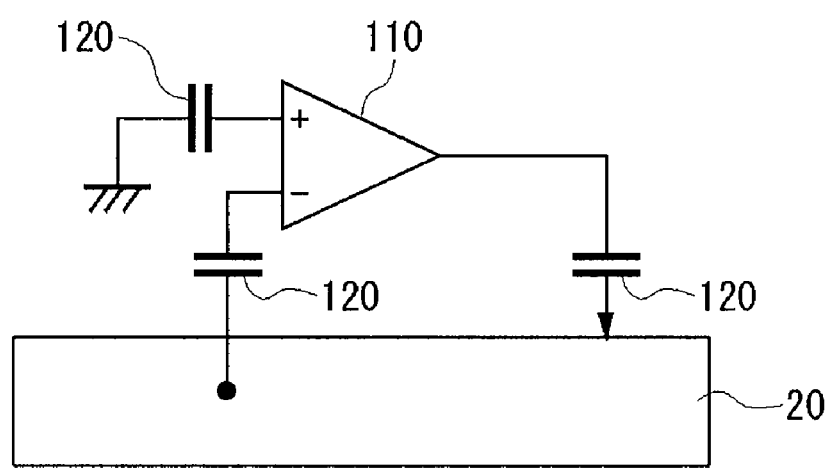
FIG. 9 shows a configuration of a circuit that contains a differential amplifier when the potential variation of a metal substrate due to noise is sufficiently behind the operating frequency of circuit elements.

The structure of a circuit device according to a fourth embodiment of the present invention is substantially the same as that of the first embodiment. The circuit device according to the present embodiment differs, however, in that a differential amplifier is provided in the place of the capacitor 62 connected to the metal substrate 20 shown in FIG. 3. Specifically, as shown in FIG. 8, one input terminal (−) of a differential amplifier 110 is connected to the metal substrate 20, the other input terminal (+) of the differential amplifier 110 is connected to ground potential, and the output terminal of the differential amplifier 110 is connected to the metal substrate 20. When there is a change in potential of the metal substrate 20 due to noise from a power element or the like, the differential amplifier 110 works in such a manner as to cancel the potential variation, thereby maintaining the potential of the metal substrate 20 at ground level. With the potential of the metal substrate 20 maintained at ground level, the noise reduction effect can be further enhanced.

Note that when the potential variation of the metal substrate due to noise is sufficiently behind the operating frequency of circuit elements, the effects of noise can be ignored. Therefore, it is only the noise of a certain frequency or above affecting the operation of circuit elements that must be dealt with, and hence capacitors 120 capable of cutting the DC components of the noise may be inserted in the respective nodes to set the metal substrate in a floating state.

(Fifth Embodiment)

Figure 10:
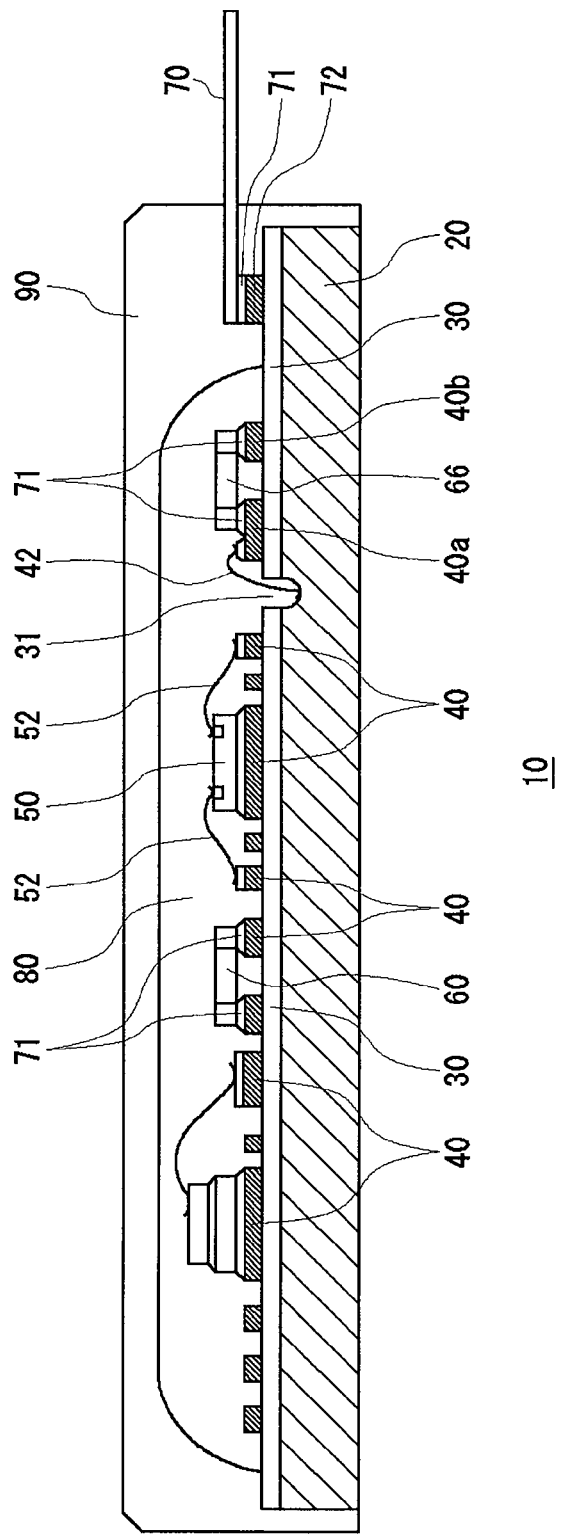
FIG. 10 is a cross-sectional view schematically showing a structure of a circuit device according to a fifth embodiment of the present invention.
Figure 11:
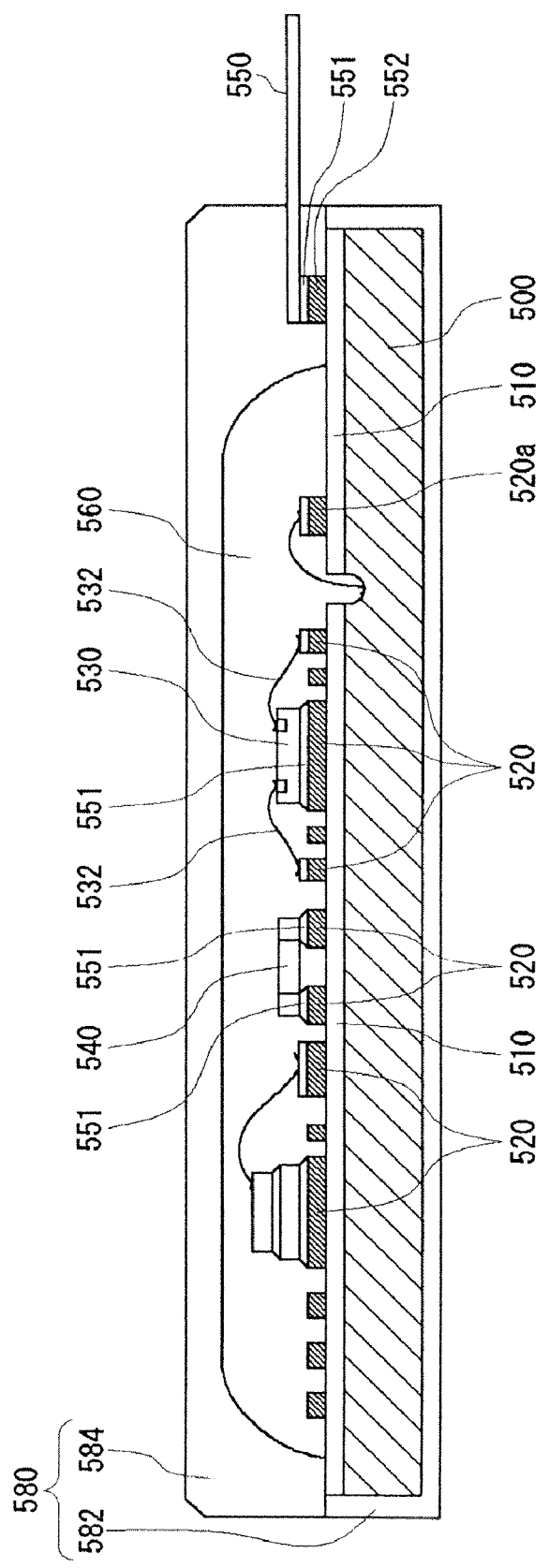
FIG. 11 is a cross-sectional view schematically showing a structure of a conventional circuit device.

The structure of a circuit device according to a fifth embodiment of the present invention is substantially the same as that of the first embodiment. The circuit device according to the present embodiment differs, however, in that, as shown in FIG. 10, a resistor 66 (50Ω, for instance) is provided in the place of the capacitor 62 connected to the metal substrate 20 shown in FIG. 3. And one end of the resistor 66 is connected to the metal substrate 20, whereas the other end of the resistor 66 is connected to ground potential. According to this arrangement, the noise of the metal substrate 20 is discharged by the resistor, so that the potential of the metal substrate 20 is maintained at ground level. In case where a short-circuiting should occur due to the exposure of the metal substrate 20, the current will be limited by the resistor 66, and therefore there will be reduced likelihood of damage to an external circuit or the like coming into contact with the metal substrate 20.

It is preferable that the resistor 66 functions as a fuse blowing when a large current above a predetermined current flows. In such an arrangement, if an overcurrent flows due to a short-circuiting or the like, the resistor 66 will be severed to prevent electric shock.

The present invention has been described by referring to each of the above-described embodiments. However, the present invention is not limited to the above-described embodiments only, and various modifications, such as changes in design, are possible. The embodiments added with such modifications are also within the scope of the present invention.

For the purpose of noise reduction, for instance, a capacitor is used in the first to third embodiments, and a resistor in the fifth embodiment. However, a capacitor and a resistor may be used in combination.

INDUSTRIAL APPLICABILITY

The present invention may find its application in the fabrication of circuit devices having circuit elements disposed on an insulating resin layer on a metal substrate.

What is claimed is:

1. A circuit device, comprising:
a metal substrate;
an insulating resin layer disposed on the metal substrate;
a wiring disposed on the insulating resin layer;
a circuit element disposed on the wiring; and
a capacitor, one terminal of the capacitor being connected to the metal substrate and another terminal the capacitor being connected to a ground potential,
wherein the capacitor and the circuit element are coated with the insulating resin, and a lower surface of the metal substrate is exposed.

* * * * *